(12) United States Patent
Diodato et al.

(10) Patent No.: US 6,794,694 B2
(45) Date of Patent: Sep. 21, 2004

(54) INTER-WIRING-LAYER CAPACITORS

(75) Inventors: Philip W Diodato, Asbury, NJ (US); Chun-Ting Liu, Berkeley Heights, NJ (US); Ruichen Liu, Warren, NJ (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 09/742,314

(22) Filed: Dec. 21, 2000

(65) Prior Publication Data

US 2002/0079522 A1 Jun. 27, 2002

(51) Int. Cl.[7] .......................... H01L 29/76; H01L 29/94
(52) U.S. Cl. ...................... 257/295; 257/301; 257/303; 257/304; 257/311
(58) Field of Search .............................. 257/295, 301, 257/303, 304, 311, 306, 758

(56) References Cited

U.S. PATENT DOCUMENTS

| | | | | |
|---|---|---|---|---|
| 5,471,418 A | * | 11/1995 | Tanigawa | 365/149 |
| 6,078,072 A | * | 6/2000 | Okudaira et al. | 257/298 |
| 6,180,976 B1 | * | 1/2001 | Roy | 257/306 |
| 6,194,757 B1 | * | 2/2001 | Shinkawata | 257/306 |
| 6,265,778 B1 | * | 7/2001 | Tottori | 257/758 |
| 6,281,535 B1 | * | 8/2001 | Ma et al. | 257/295 |

* cited by examiner

*Primary Examiner*—Jerome Jackson
*Assistant Examiner*—Joseph Nguyen
(74) *Attorney, Agent, or Firm*—Richard J. Botos

(57) ABSTRACT

An integrated circuit includes a semiconductor substrate with semiconductor devices formed therein and thereon, a first wiring layer located over the substrate, a second wiring layer located on the first wiring layer, and a capacitor. The capacitor has metal-based charge-storage electrodes that extend through the second wiring layer and at least part of the first wiring layer. The wiring layers have interconnect wire embedded therein.

8 Claims, 8 Drawing Sheets

INTER-WIRING-LAYER CAPACITORS

BACKGROUND OF THE INVENTION

1. Field of the Invention

This invention relates generally to integrated circuits, and more particularly to capacitors in integrated circuits.

2. Discussion of the Related Art

Many integrated circuits use on-chip capacitors. The on-chip capacitors are either located in trenches in semiconductor substrates or stacked above the semiconductor substrates.

Typically, the trench capacitors are made prior to finishing devices in the substrate. To withstand subsequent device finishing, the trench capacitors use materials tolerant of anneals used to finish devices. The tolerant materials include doped polysilicon, which is used for capacitor charge-storage electrodes, and silicon nitride and silicon dioxide, which are used for capacitor dielectrics.

Typically, the stacked capacitors are fabricated after finishing devices located in the substrate. Since the stacked capacitors do not have to tolerate the harsh anneals used to finish the devices in the substrate, the stacked capacitors are able to exploit fragile materials with better electrical properties. The fragile materials include new capacitor dielectrics and metal-based charge-storage electrode materials. The new dielectrics have higher dielectric constants than silicon dioxide or silicon nitride and thus, produce higher capacitances. The metal-based materials have lower resistances than doped polysilicon and thus, lower resistances of charge-storage electrodes and capacitor charge and discharge times.

Some stacked capacitors use both the new dielectrics and metal-based charge-storage electrode materials. Constructing these stacked capacitors requires several lithographic steps that use different masks. In one such step, a first mask is used to control an etch of a via in a dielectric layer. In another such step, a second mask is used to form a charge-storage electrode in the previously etched via. The use of several masks complicates construction of these stacked capacitors.

BRIEF SUMMARY OF THE INVENTION

In one aspect, the invention features an integrated circuit. The integrated circuit includes a semiconductor substrate with semiconductor devices formed therein and thereon, a first wiring layer located over the substrate, a second wiring layer located on the first wiring layer, and a capacitor. The capacitor has metal-based charge-storage electrodes that extend through the second wiring layer and at least part of the first wiring layer. The wiring layers have interconnect wire embedded therein.

In another aspect, the invention features a process for forming an integrated circuit. The process includes providing a semiconductor substrate with semiconductor devices, forming a first wiring layer and a portion of a second wiring layer over the substrate, opening a window that is continuous through the first wiring layer and the portion of the second wiring layer, and forming a capacitor in the window. The capacitor has charge-storage electrodes that extend through the first wiring layer and the portion of the second wiring layer.

In another aspect, the invention features a process for fabricating an integrated circuit with embedded memory cells. The process includes providing a substrate with semiconductor devices for logic circuits and for DRAM cells in first and second physical regions, respectively, and fabricating a first and at least a portion of a second wiring layer over the substrate. The interconnect wire is not present in the wiring layers over the second regions. The process also includes fabricating a capacitor with metal-based charge-storage electrodes that extend through the thickness of the first wiring layer and the portion of the second wiring layer over the second regions.

BRIEF DESCRIPTION OF THE SEVERAL VIEWS OF THE DRAWING

In different Figures, like reference numbers refer to like features.

DETAILED DESCRIPTION OF THE INVENTION

The present application incorporates by reference in their entirety U.S. patent application Ser. No. 09/544,234, filed on Apr. 7, 2000, and U.S. patent application Ser. No. 09/477,310, filed on Jan. 4, 2000.

Figure 1A:
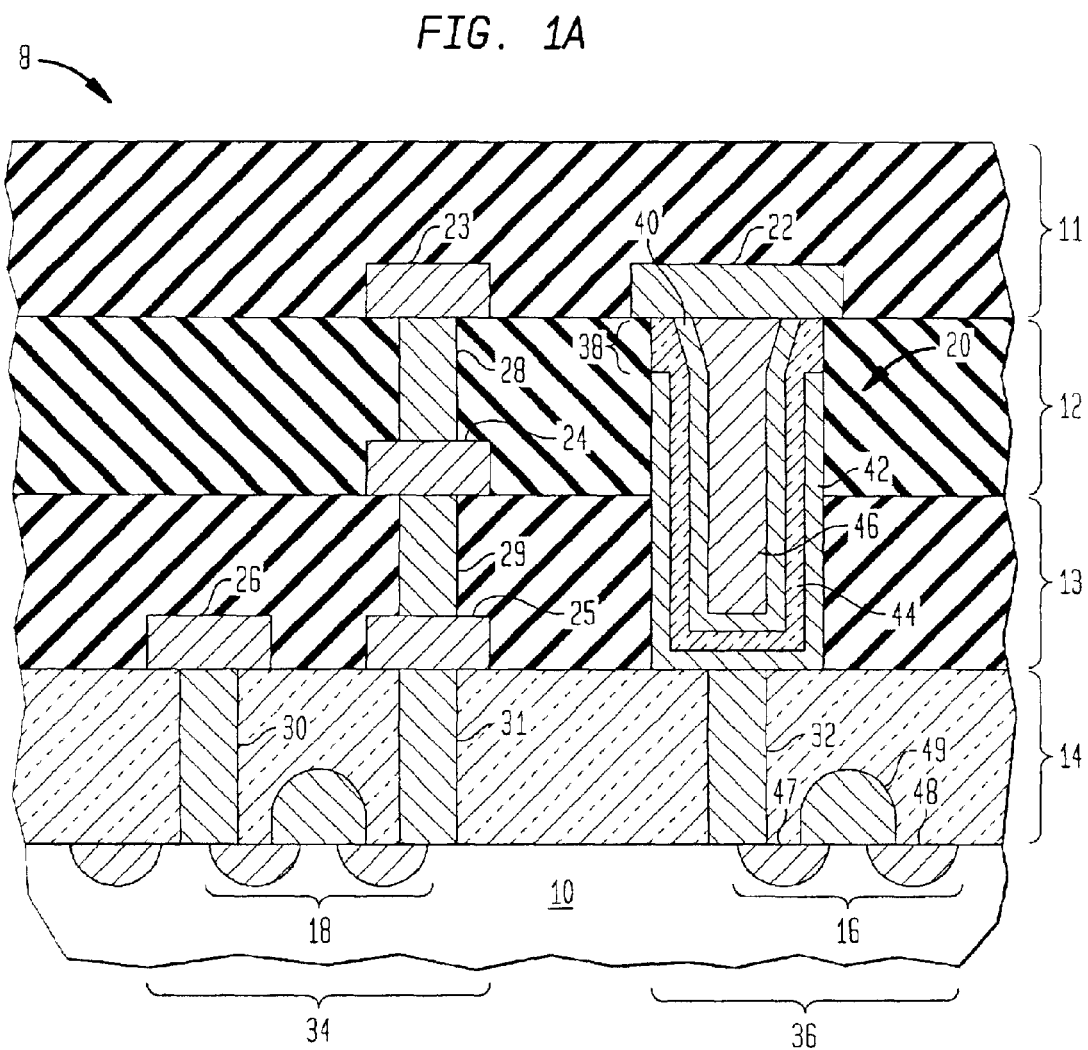
FIG. 1A is a cross-sectional view of a portion of one integrated circuit (IC) having an inter-wiring-layer capacitor.

FIG. 1A shows a portion of one integrated circuit (IC) 8. The IC 8 includes a semiconductor substrate 10, semiconductor devices 16, 18 located on the substrate 10, and a protective dielectric layer 14 covering both the semiconductor devices 16, 18 and the substrate 10. Exemplary semiconductor devices 16, 18 include transistors, diodes, and resistors. The IC 8 also includes multiple wiring layers 11–13 located on the layer 14, and an inter-wiring-layer capacitor 20 stacked over the protective layer 14. The inter-wiring-layer capacitor 20 extends through more than one of the wiring layers 12–13.

The wiring layers 11–13 have dielectric matrices of approximately constant thickness and metal-based interconnect wire 22–26, e.g., aluminum-based wire, that is embedded in the dielectric matrices. The interconnect wire 22–26 of the different wiring layers 11–13 connect together and to the devices 16, 18 through metal plugs 28–31, e.g., tungsten, copper, aluminum, nickel, or cobalt plugs. The interconnect wire 22–26 and metal plugs 28–32 form a pattern that electrically connects together semiconductor devices 16, 18 on/in substrate 10 and also electrically connects the inter-wiring-layer capacitor 20 to semiconductor device 16.

Some embodiments of IC 8 are embedded DRAM (EDRAM) ICs that include separate physical regions 34 for logic circuits and physical regions 36 for DRAM cells. In these embodiments, inter-wiring-layer capacitor 20 and device 16 form a single DRAM memory cell.

Inter-wiring-layer capacitor 20 includes an inner charge-storage electrode 40, an outer charge-storage electrode 42, and a dielectric layer 44 interposed between the charge-storage electrodes 40, 42. Exemplary capacitor charge-storage electrodes 40, 42 are formed of titanium nitride (TiN), tantalum nitride (TaN), tungsten nitride (WN), or tungsten (W) and have thicknesses of about 20 nanometers (nm). Exemplary capacitor dielectric layers 44 are formed of tantalum penta-oxide ($Ta_2O_5$), barium strontium titanate ($BaSrTiO_4$), aluminum oxide ($Al_2O_3$), zirconium oxide ($ZrO_2$), halfnium oxide ($HfO_2$), or other high dielectric constant insulators and have thicknesses of about 10 nm.

The contacts to inner and outer charge-storage electrodes 40, 42 of inter-wiring-layer capacitor 20 provide the capacitor's electrical connections. The outer charge-storage electrode 42 physically contacts metal plug 32, which electrically connects the outer charge-storage electrode 42 to doped region 47 of device 16, e.g., a source or drain region of a transistor. The inner charge-storage electrode 40 physically contacts metal-based interconnect wire 22 of wiring layer 11. An annular gap 38 filled by dielectric insulates the outer charge-storage electrode 42 from the interconnect wire 22 that physically contacts the inner charge-storage electrode 40. The gap 38 ensures that the capacitor's outer charge-storage electrode does not short through the interconnect wire 22.

The inter-wiring-layer capacitor 20 also has a central region 46 defined by the shape of inner charge-storage electrode 40. The central region 46 is filled with a metal-based material such as tungsten (W). The tungsten in the central region provides an electrical connection between inner electrode 40 and interconnect wire 22.

An exemplary embodiment of inter-wiring-layer capacitor 20 is consistent with 0.15-micron CMOS technology size constraints and occupies a rectangular area above the surface of protective layer 14. The rectangular area has side lengths of about 240 nm and about 520 nm. Other inter-wiring-layer capacitors have charge-storage electrodes that extend through a set of N adjacent wiring layers and have lengths of about N×400 nm to N×800 nm in a direction normal to the surface of substrate 10. N is equal to 2, 3, 4, 5 or more, and these inter-wiring-layer capacitors have a capacitance of about $25 \times 10^{-15}$ Farads or more.

In other embodiments, one or both of charge-storage electrodes 40, 42 of inter-wiring-layer capacitor 20 electrically connect to metal-based interconnect wire of other wiring layers 11–13 and/or to other devices 18 located on substrate 10.

Figure 8:
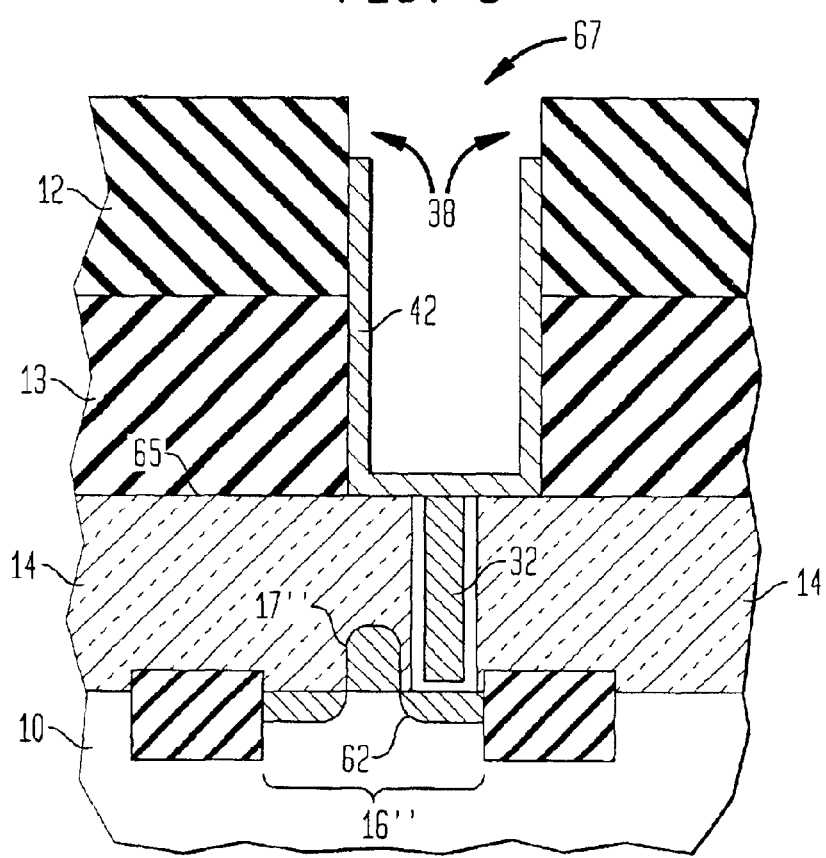
Figure 9:
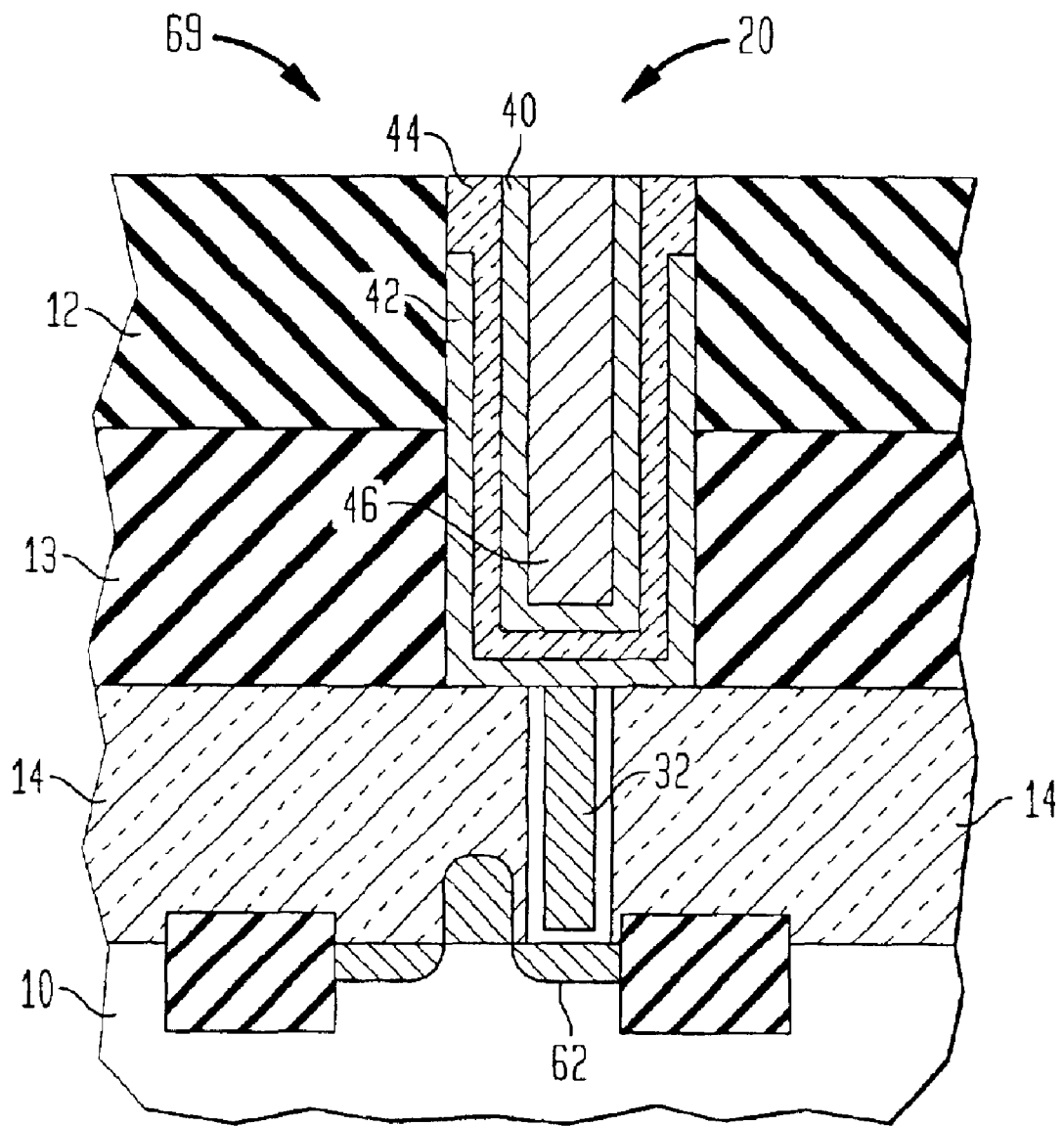

Extending charge-storage electrodes 40, 42 of capacitor 20 across multiple wiring layers 12–13 produces larger charge-storage electrode areas and capacitances per area parallel to the surface of substrate 10. The available area parallel to the surface is also increased by the use of metal plug 32, which increases tolerances to alignment mismatches in the positioning of window 67 (see e.g., FIG. 8) that is used to construct the capacitor. The increased tolerance results because the plug 32 vertical isolates the window 67 from the substrate 10. Due to the isolation, a lateral alignment error during the etch of the window 67 does not damage devices, e.g., device 16" in FIG. 8.

Some embodiments of the inter-wiring-layer capacitor 20 have a larger capacitance than conventional capacitors with the same charge-storage electrode areas and charge-storage electrode separations, because the inter-wiring-layer capacitors 20 use better dielectric layers 44 than the conventional capacitors.

Figure 1B:
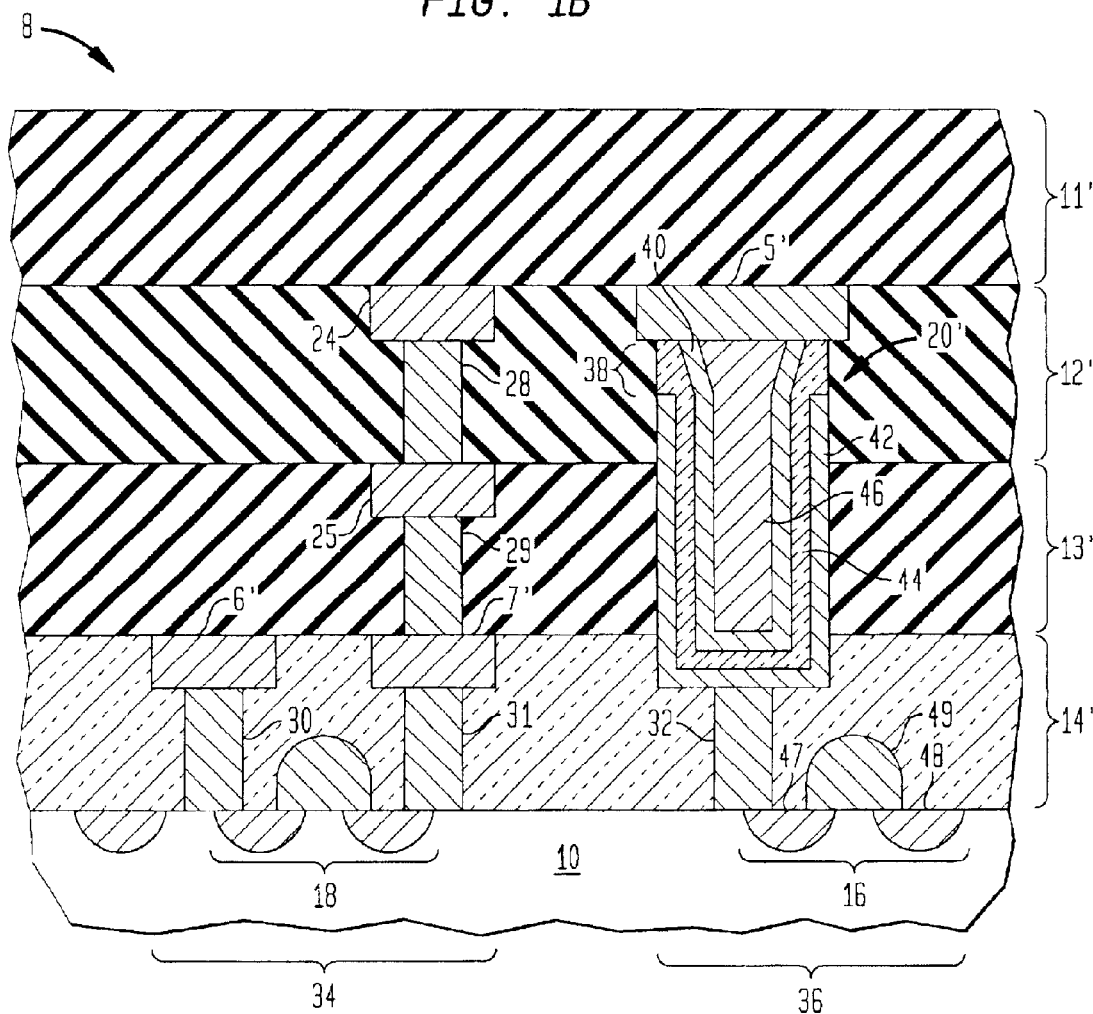
FIG. 1B is a cross-sectional view of a portion of another IC having an inter-wiring-layer capacitor.

FIG. 1B shows an alternate IC 8'. The IC 8' includes semiconductor substrate 10, semiconductor devices 16, 18, and a new protective dielectric layer 14' covering both the devices 16, 18 and the substrate 10. The new protective layer 14' contains a layer of copper-based interconnect wiring 6', 7'. The IC 8' has wiring layers 11'–13' located on the protective layer 14', and an inter-wiring-layer capacitor 20', which projects partially into the protective layer 14'.

The inter-wiring-layer capacitor 20' extends through wiring layer 13', a portion of wiring layer 12', and a portion of the protective layer 14' located on the substrate 10. The capacitor 20' is constructed like capacitor 20, shown in FIG. 1A, and has an inner charge-storage electrode 40 that contacts interconnect wire 5' of the wiring layer 12'.

The wiring layers 11'–13' have dielectric matrices of approximately constant thickness and copper-based interconnect wire 5', 24–25 and metal plugs 28, 29 made by a dual damascene process. The interconnect wire 24–25, 5'–7' connect together and to the devices 16, 18 through the copper-based plugs 28–29 and the tungsten-based plugs 30–32. The interconnect wire 5'–7', 24–25 and plugs 28–32 form a pattern that electrically connects together semiconductor devices 16, 18 on substrate 10 and also electrically connects the inter-wiring-layer capacitor 20' to semiconductor device 16.

The IC 8' is an EDRAM that includes separate physical regions 34 for logic circuits and physical regions 36 for DRAM cells.

Figure 2:
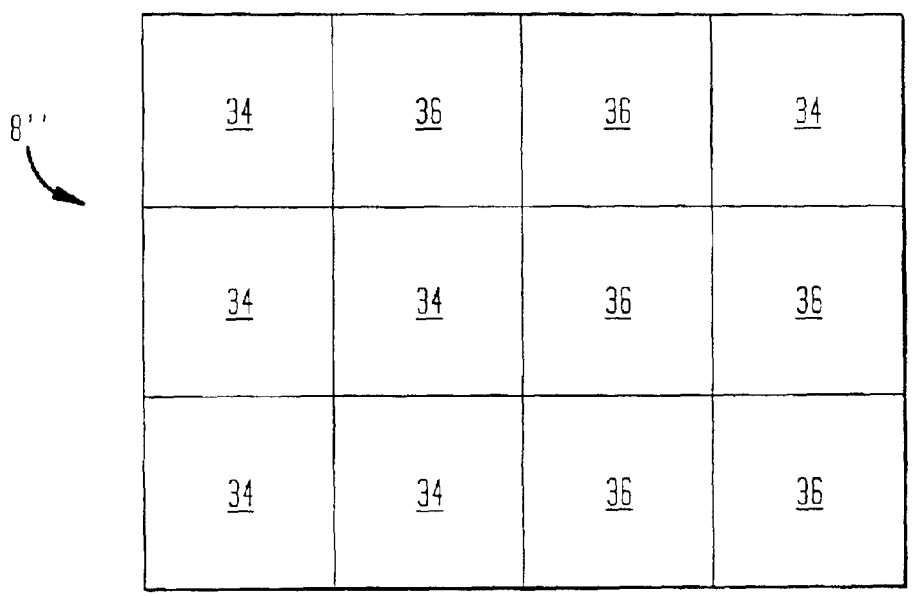
FIG. 2 is a top view of an embedded DRAM (EDRAM) that uses the inter-wiring-layer capacitor of FIG. 1.
Figure 3:
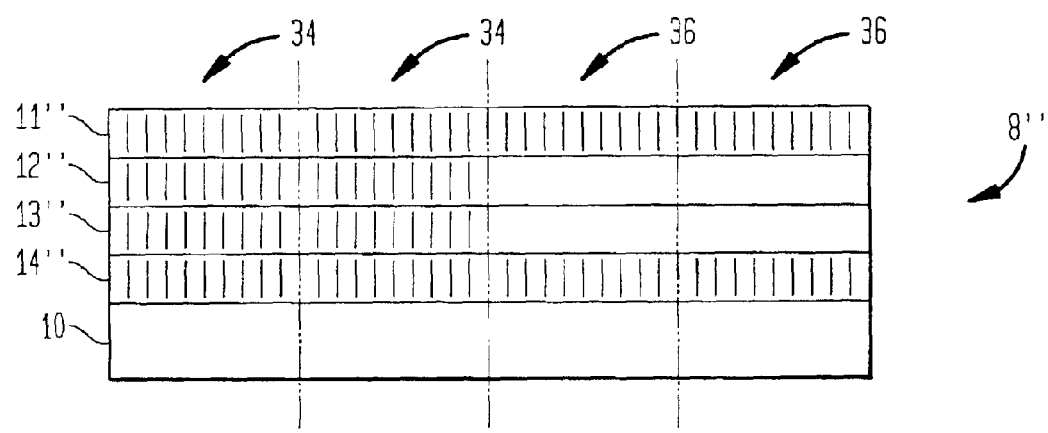
FIG. 3 is a side view of the EDRAM of FIG. 2.

FIGS. 2 and 3 show an IC 8" that has both logic circuits and DRAM cells, i.e. an EDRAM. The IC 8" includes a semiconductor substrate 10 with separate physical regions 34 and 36 for respective logic circuits and DRAM cells. The logic circuit and DRAM cell regions 34, 36 connect electrically via multiple wiring layers 11"–13" stacked over the semiconductor substrate 10. Due to differences in circuit complexities, the wiring layers 11–13 include less metal interconnect wire in the DRAM cell regions 36 than in the logic circuit regions 34 of IC 8". In particular, several of the wiring layers 12–13 do not have metal-based interconnect wire in the DRAM cell regions 36 and do have metal-based interconnect wire in the logic circuit regions 36.

Some exemplary EDRAMs have six or more of wiring layers with metal interconnect wire in logic circuit regions and only three wiring layers with metal interconnect wire in DRAM cell regions due to the lower complexity of DRAM cells.

In DRAM cell regions 36 of the EDRAM, the wiring layers 12–13 do not have metal interconnect wire provide available space for other uses. This available space holds inter-wiring-layer capacitors 20 in the exemplary IC 8".

As device integration increases, smaller chip areas are available for on-chip components such as capacitors. Available space in wiring layers 12–13 above DRAM cell regions 36 provides space for the capacitors. Putting the capacitors in these "empty regions" of the wiring levels 12–13 also enables satisfying integration demands without reducing areas of capacitor charge-storage electrodes, which would otherwise reduce charge storage capacities.

Forming capacitors in regions 36 of wiring layers 12–13 that are devoid of metal interconnect wire also improves mechanical properties of the EDRAM. Regions of wiring layers with less metal interconnect wire are less dense and mechanically rigid than regions with more metal interconnect wire. Differences between the rigidity of the various regions make an IC more difficult to planarize using chemical mechanical polishing (CMP). Placing inter-wiring-layer capacitors 20 in DRAM cell regions 36 of the IC 8" reduces variations between the mechanical rigidity of the logic circuit and DRAM cell regions 34, 36 and makes the IC 8" more amenable to precise planarization by CMP.

Figure 4:
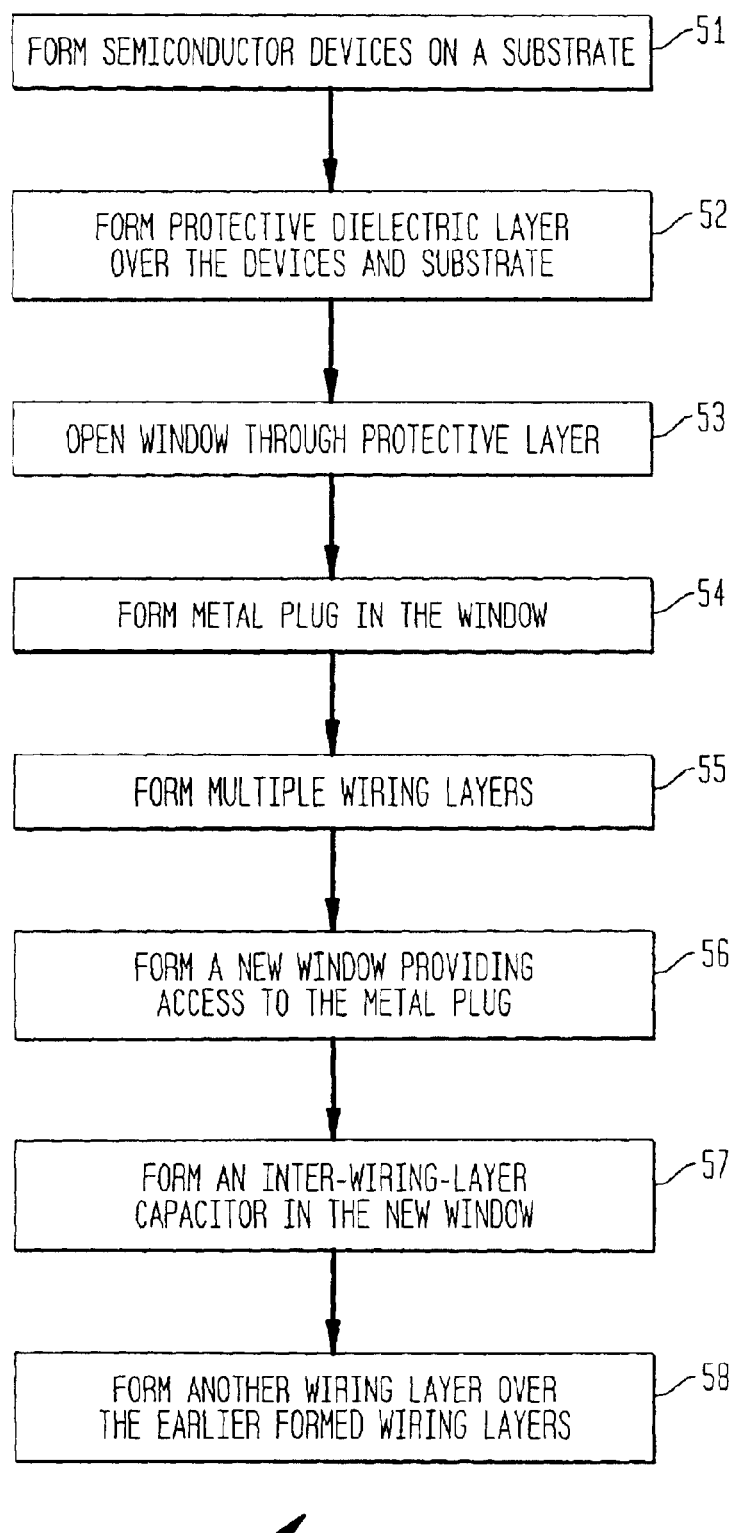
FIG. 4 is a flow chart showing one process for fabricating the inter-wiring-layer capacitor of FIG. 1A.
Figure 5:
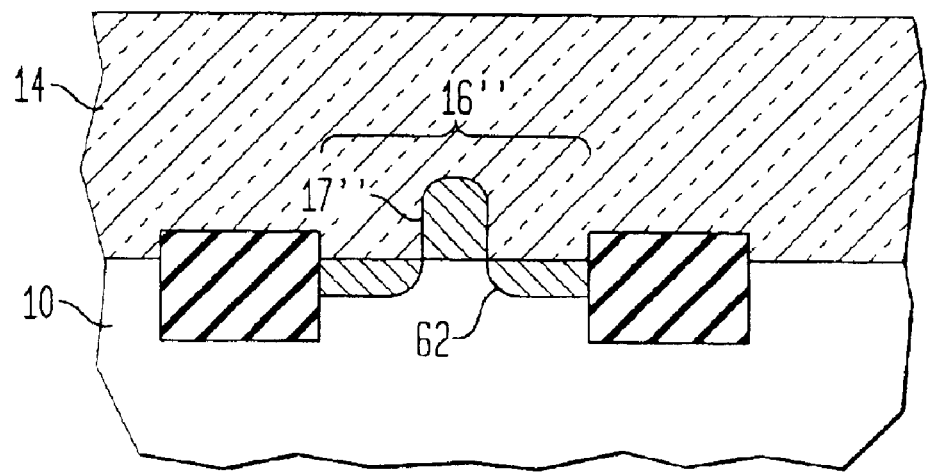
FIGS. 5–10 show various stages of the construction of inter-wiring-layer capacitor according to the process of FIG. 4.

FIG. 4 shows a process 50 for fabricating an integrated circuit with an inter-wiring-layer capacitor, i.e., capacitor 20 of FIG. 1A. Intermediate stages of the fabrication process 50 are shown in FIGS. 5–10.

Prior to constructing capacitor 20, semiconductor devices such as field-effect-transistor 16 with source 47, drain 48, and gate 49, are formed on and in semiconductor substrate 10 by methods known to those of skill in the art (step 51). For physical protection, a dielectric layer 14 is deposited and planarized using CMP (step 52). In an exemplary process, the dielectric layer 14 includes thin silicon nitride and undoped oxide layers with respective thicknesses of about 30 nm–100 nm and about 200 nm–400 nm and a thicker protective layer of phosphorus-doped oxide layer with a thickness of about 600 nm–1,200 nm. Then, the CMP of the exemplary process planarizes the dielectric to a thickness of about 400 nm–1,200 nm to remove non-uniformities, e.g., caused by underlying gate structure 17" shown in FIG. 5. The protective layer 14 covers the device 16" and the substrate 10 itself.

Figure 6:
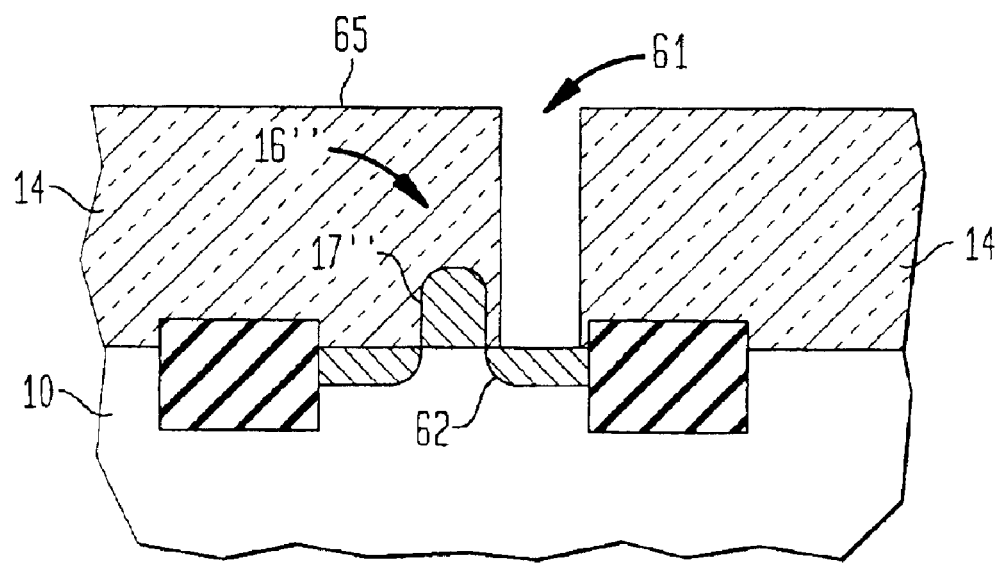
Figure 7:
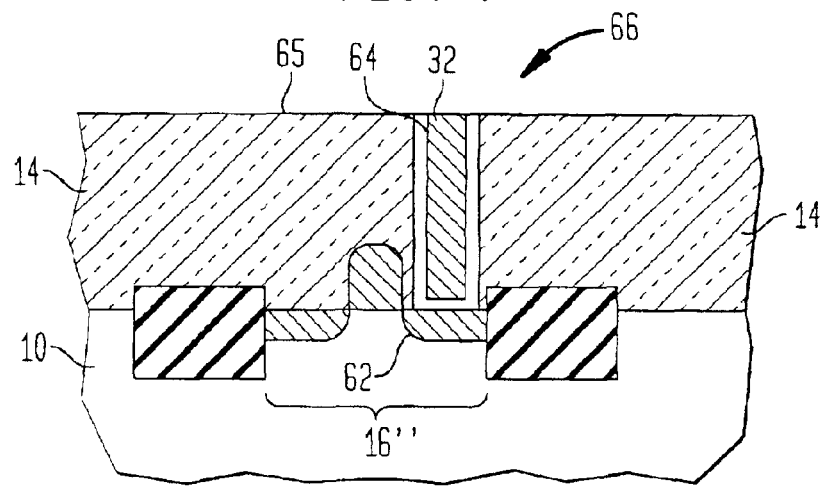

After planarizing protective layer 14, a mask-controlled etch opens a window 61 through protective layer 14 as shown in FIG. 6 (step 53). The mask aligns the etch so that window 61 provides access to doped region 62, which is located in a portion of substrate 10 buried below the protective layer 14. In exemplary embodiments, the doped region 62 is a source or drain of a field-effect-transistor. The thin silicon nitride portion of the layer 14 covers the device 16" and makes the etch self-aligning so that small etch misalignments do not cause damage to gate structure 17".

In window 61, a series of depositions forms metal plug 32 (step 54). The metal plug 32 both fills the window 61 and provides an electrical contact to doped region 62 as shown in structure 66 of FIG. 7.

To prepare window 61 for plug 32, an RF sputtering performs an argon cleaning of oxide from substrate 10 under window 61, and a chemical vapor deposition (CVD) deposits a barrier 64 on the surfaces of window 61. The barrier 64 is a conformal layer of Ti, TiN, Ta, or TaN or a conformal sandwich of Ti/TiN or Ta/TaN layers. Then, another CVD fills the window 61 with a metal such as tungsten. Excess metal filler and barrier material are removed from surface 65 of protective layer 14 by either a reactive ion etch (RIE) or a CMP thereby producing structure 66 of FIG. 7.

After forming metal plug 32, two or more wiring layers 12–13 are formed on protective dielectric layer 14 (step 55). Forming a wiring layer 12–13 includes depositing a dielectric matrix, forming metal-based interconnect wire under control of a mask, and planarizing the surface of the wiring layer 12–13 by a CMP, i.e., to remove excess metal, dielectric, and/or mask material. The mask controls the pattern of the interconnect wire so that a desired device wiring configuration results. The CMP uniformizes the outer surface of the wiring layer so that subsequent anisotropic etches are better controlled. In the wiring layers 12–13, the pattern of the interconnect wire includes metal traces over logic circuit regions 34, and no metal traces over DRAM cell regions 36.

An exemplary embodiment forms interconnect wiring by a sequence of physical vapor depositions (PVDs) under control of a mask. The PVDs deposit a stack of about 10–25 nm of titanium (Ti), about 25–60 nm of titanium nitride (TiN), about 300–600 nm of aluminum (with a 0.5 weight percent of Cu), and about 25–60 nm of TiN at about 200° C. to about 300° C. After forming the aluminum-based interconnect wiring, a high-density plasma (HDP) process or a CVD at a temperature below about 400° C. deposits the dielectric matrix, e.g., about 1,000–1,800 nm of silica-glass that may be doped with fluorine. The dielectric layer is planarized to a uniform thickness to about 400 nm–800 nm by the CMP.

After forming wiring layers 12–13, a mask-controlled etch opens a new window 67 that extends through multiple wiring layers 12–13 to provide access to metal plug 32 (step 56). Through the wiring layers 12–13, the alignment of the new window 67 to the metal plug 32 is accomplished by an alignment mark at the level of window 61. Since the dielectric matrix in the wiring layers 12–13 is transparent to laser light, laser beams are used to perform the alignment of the new window 67. The new window 67 is formed by a reactive ion etch (RE) that uses $CHF_3$, $CF_4$, or $C_2F_8$ chemistry and endpoint triggering based-on detection of volatile metal fluorides, e.g., $WF_x$, in etching gases. Exemplary windows have side widths of about 0.24 microns by about 0.52 microns consistent with 0.15-micron CMOS technology.

In the new window 67, inter-wiring-layer capacitor 20 is formed (step 57). The forming step makes structure 69 of FIG. 9 by forming outer metal-based charge-storage electrode 42 on the window 67, depositing dielectric layer 44 on the outer charge-storage electrode 42, forming inner metal-based charge-storage electrode 40 on the dielectric layer 40, and depositing a filler in central region 46 of the window 67. The outer and inner metal-based charge-storage electrodes 42, 40 extend across more than one wiring layer 12–13, because they line window 67, which extends across more than one wiring layer 12–13.

Forming outer metal-based charge-storage electrode 42 includes depositing a layer of metal-based material, sizing the deposited layer, and annealing the sized layer. The deposition results from a CVD at a temperature of about 300° C.–400° C. and a pressure of about $10^{-3}$ Torr–1 Torr. The CVD lines the interior of window 67 with a conformal layer of about 20 nm of TiN. The deposited layer of TiN makes physical contact with metal plug 32. The sizing involves removing TiN from gap 38 shown in FIG. 8. The gap 38 ensures that the outer charge-storage electrode 42 is electrically isolated from subsequently deposited wiring layer 11 of FIG. 1. The annealing treats the TiN layer at a temperature of about 200° C.–300° C. in a forming gas of about 10 molar percent hydrogen gas and 90 molar percent nitrogen gas. The anneal generates a downstream plasma of hydrogen, oxygen, and nitrogen in a photoresist stripping tool.

In a model PEP 3010A down stream plasma photoresist stripper, which is made by Gasonics Inc. of 404 E. Plumeria Drive, San Jose, Calif. 95134, the anneal is performed at a wafer chuck temperature of 250° C., a total pressure of 2 Torr, and a power of 1400 watts. In the Gasonics tool, the anneal includes passing the above-described forming gas over the substrate for about 10 seconds and at a flow rate of 2000 standard cubic-centimeter per minute (sccm). Next, the forming gas and oxygen gas are passed over the substrate for 60 seconds, both gases having flow rates of about 1000 sccm. Finally, for 10 more seconds, the above-described forming gas is passed over the substrate at a flow rate of about 2000 sccm.

To size the deposited TiN layer, photoresist is spun onto wiring layer 12 to form a covering with a surface thickness of about 500 nm. The photoresist also fills window 67. About 800 nm deep of photoresist is removed by a $CHF_3$-based anisotropic RIE. Thus, the RIE removes the photoresist both from the surface of the wiring layer 12 and also from an outer lip of the window 67 to a depth of about 300 nm below the surface of the wiring layer 12. In the region free of photoresist, an isotropic plasma etch then, removes the TiN layer from the window 67. The isotropic plasma etch uses $BCl_3$ and $CHF_3$ and is performed at room temperature with no bias voltage. After etching TiN from the gap 38, a stripping tool is used to remove the remaining photoresist from the window 67.

To form dielectric layer 44, a CVD of dielectric is performed at a temperature of about 350° C.–450° C. and a pressure of about $10^{-3}$–$10^{-2}$ Torr. The CVD deposits a conformal dielectric layer with a thickness of about 10 nm on metal-based charge-storage electrode 42. Exemplary dielectrics include $Ta_2O_5$, $BASrTiO_4$, $Al_2O_3$, $ZrO_2$, $HfO_2$, and other high dielectric constant insulators. These fragile dielectrics are available, because subsequent processing does not use high 600° C.–1,000° C. temperatures, which would otherwise destroy the dielectrics.

The deposited dielectric is annealed at a temperature of about 200° C. to about 300° C. in a mixture or oxygen gas and nitrogen gas. This generates a downstream plasma of oxygen and nitrogen in the stripping tool. The plasma anneal further enhances the properties of the dielectric layer by correcting compositional chemical stoichiometries therein. In the model PEP 3010A Gasonics stripping tool, the anneal is performed at a wafer chuck temperature of 300° C., a pressure of 2 Torr, and a power of 1400 watts. The anneal includes passing nitrogen gas and oxygen gas over the substrate for 120 seconds at respective flow rates of 1000 sccm and 2000 sccm.

To form inner charge-storage electrode 40, another CVD deposits a conformal TiN layer with a thickness of about 20 nm on already formed dielectric layer 44.

The formed inner charge-storage electrode 40 defines a central region 46 of window 67 that is empty. To fill central region 46, a CVD deposits tungsten. Finally, a CMP planarizes the outer surface of wiring layer 12 to remove charge-storage electrode, excess dielectric, mask material, and tungsten from on that surface.

Figure 10:
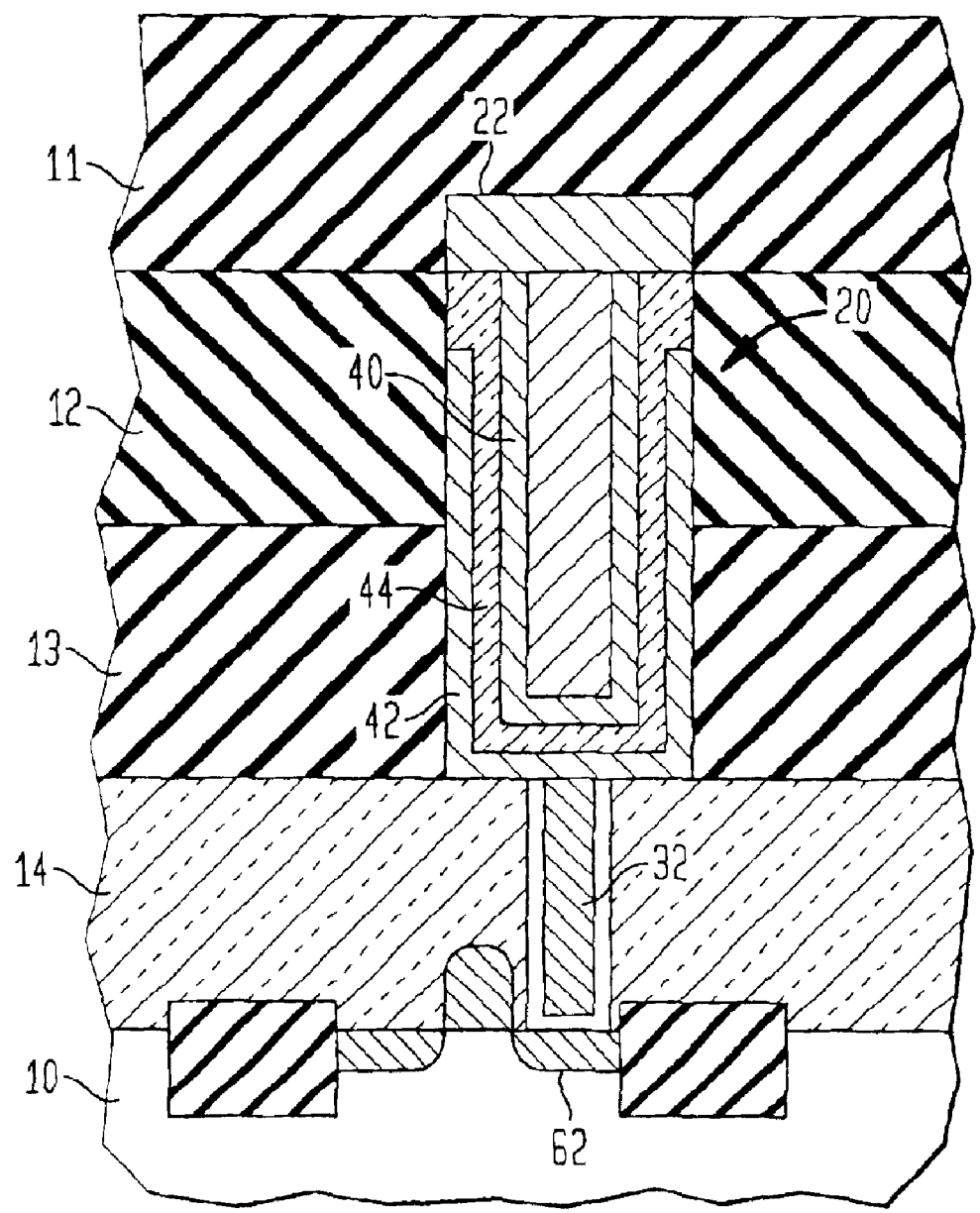

After forming capacitor 20, another wiring layer 11 is formed on the earlier-formed wiring layers 12–13 (step 58). The new wiring layer 11 includes interconnect wire 22, which contacts both the tungsten in region 46 and inner electrode 40 as shown in FIG. 10. The interconnect wire 22 is formed by a mask-controlled PVD of a barrier layer of Ti and TiN and a mask-controlled PVD of aluminum with 0.5 weight percent copper. The rest of the formation of wiring layer 11 uses the above-described process.

Alternate embodiments directly contact inner charge-storage electrode 40 via a metal plug (not shown).

To fabricate alternate IC 8', shown in FIG. 1B, wiring layer 13' is formed with a copper-based dual damascene process. In the dual damascene process, the dielectric matrix of a wiring layer is deposited, trenches are etched into the dielectric matrix under control of a mask, and interconnect wire is deposited in the trenches. The deposition of interconnect wire includes a PVD or a CVD of about 25 nm–50 nm of barrier material, i.e., tantalum (Ta) or tantalum nitride (TaN) and about 50 nm–150 nm of seed copper, and then, an electroplating deposition of a layer of about 500–1000 nm of copper. The deposited copper is annealed at low temperatures of about 100° C.–400° C. Then, a CMP removes excess copper and barrier material and planarizes the surface of the dielectric.

To fabricate wire layer 12', shown in FIG. 1B, a portion of the dielectric matrix of the wire layer 12' is formed first. Then, capacitor 20' is formed in the already formed portion of the wiring layer 12' by the above-described process for capacitor 20 of FIG. 1A. Finally, the remainder of the wiring layer 12' is formed over the capacitor 20'.

To form the remainder of wiring layer 12', more dielectric matrix is deposited, vias and trenches are opened, and interconnect wire 5', 24 and copper-based plugs 28 are formed therein by the dual-damascene process. Masks control the etches of the vias and trenches, and one trench makes contact with inner charge-storage electrode 40. To form the copper-based plug 28 and interconnect wire 5', 24, a Ta or TaN barrier layer is deposited, a layer of seed copper is deposited, and a layer of copper is electroplated onto the layer of seed copper as described for wiring layer 13'. Finally, a CMP removes the excess barrier material and copper from the surface of the wiring layer 12'. Additional interconnect wiring and contact pads, if desired, may be added in wiring layer 11' and further wiring layers using the same copper-based dual damascene process.

Other embodiments of the invention will be apparent to those skilled in the art in light of the specification, drawings, and claims of this application.

What is claimed is:

1. An integrated circuit, comprising:

a semiconductor substrate including semiconductor devices;

a first wiring layer having an associated thickness being located over the substrate and having interconnect wire embedded therein;

a second wiring layer having an associated thickness being located on the first wiring layer and having interconnect wire embedded therein; and a capacitor having a first metal-based charge-storage electrode, a second metal-based charge-storage electrode, and a dielectric layer interposed between the charge-storage electrodes, the charge-storage electrodes extending through the thickness of the second wiring layer and at least part of the first wiring layer wherein the capacitor is completely disposed in a window formed through the thickness of the second wiring layer and at least part of the first wiring layer.

2. The circuit of claim 1, wherein the dielectric layer comprises one of $Ta_2O_5$, $BaSrTiO_4$, $Al_2O_3$, $ZrO_2$, and $HfO_2$.

3. The circuit of claim 1, wherein a first region of the substrate includes dynamic random access memory cells;

a second region of the substrate includes logic circuits and is physically separate from the first region; and the capacitor is located in a portion of the wiring layers located over the first region of the substrate.

4. The circuit of claim 3, wherein the capacitor is a functional portion of one of the random access memory cells.

5. The circuit of claim 1, further comprising:

a third wiring layer being located on the second wiring layer and having metal-based interconnect wire embedded therein, the first charge-storage electrode of the capacitor being in physical contact with a portion of the interconnect wire of the third layer.

6. The circuit of claim 1, further comprising:

a tungsten plug being located between the second charge-storage electrode and a portion of the substrate.

7. The circuit of claim 1, wherein at least one of the wiring layers is a dual damascene wiring layer.

8. The circuit of claim 1, further comprising:

a transistor located on the substrate; and a metal plug electrically connecting the second charge-storage electrode to one of a source and a drain of the transistor.

* * * * *